United States Patent [19]
McElroy

[11] 4,416,049
[45] Nov. 22, 1983

[54] SEMICONDUCTOR INTEGRATED CIRCUIT WITH VERTICAL IMPLANTED POLYCRYSTALLINE SILICON RESISTOR

[75] Inventor: David J. McElroy, Houston, Tex.

[73] Assignee: Texas Instruments Incorporated, Dallas, Tex.

[21] Appl. No.: 223,446

[22] Filed: Jan. 8, 1981

Related U.S. Application Data

[63] Continuation of Ser. No. 910,248, May 30, 1970, abandoned.

[51] Int. Cl.³ .............................................. H01L 21/22
[52] U.S. Cl. .................................... 29/571; 29/577 R; 29/589; 29/590; 29/610 R; 148/187; 357/51; 357/59
[58] Field of Search ................. 29/571, 577 R, 577 C, 29/589, 590, 610; 357/51, 59; 148/187

[56] References Cited
U.S. PATENT DOCUMENTS

| | | | |
|---|---|---|---|
| 3,138,743 | 6/1964 | Kilby | 29/578 |
| 3,460,007 | 8/1969 | Scott | 357/51 X |
| 3,570,114 | 3/1971 | Bean et al. | 29/577 R |
| 4,110,776 | 8/1978 | Rao et al. | 357/51 X |
| 4,146,902 | 3/1979 | Tanimoto et al. | 357/51 X |
| 4,178,674 | 12/1979 | Liu et al. | 29/577 C |
| 4,187,602 | 2/1980 | McElroy | 29/577 R |
| 4,208,781 | 1/1980 | Rao et al. | 29/577 C |
| 4,214,917 | 7/1980 | Clark et al. | 29/577 C |
| 4,246,692 | 1/1981 | Rao | 29/577 R |

*Primary Examiner*—G. Ozaki
*Attorney, Agent, or Firm*—John G. Graham

[57] ABSTRACT

Integrated circuit resistor elements which may be used as load devices in static MOS RAM cells are created vertically in polycrystalline silicon ion implanted to provide the desired resistivity. The method of making these devices is compatible with a standard self-aligned N-channel silicon-gate process. The cell size is reduced as the resistors can overly other elements, and an efficient layout provides a very small cell area.

5 Claims, 9 Drawing Figures

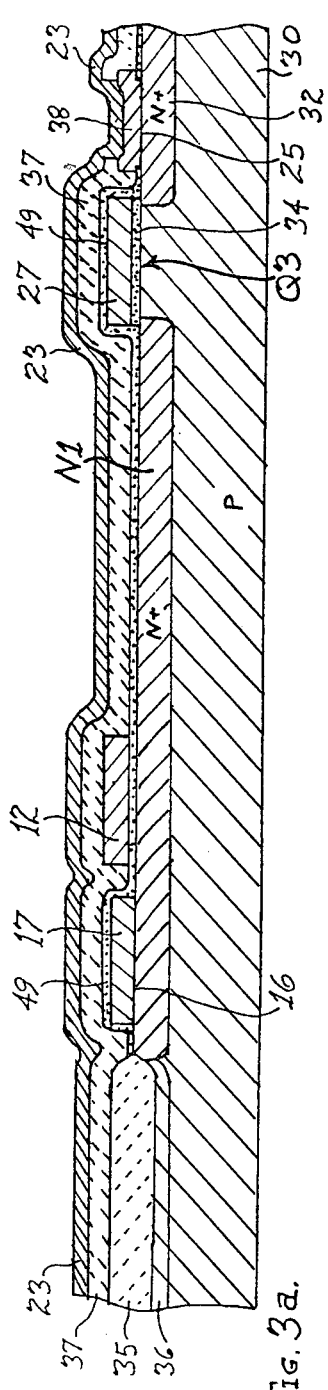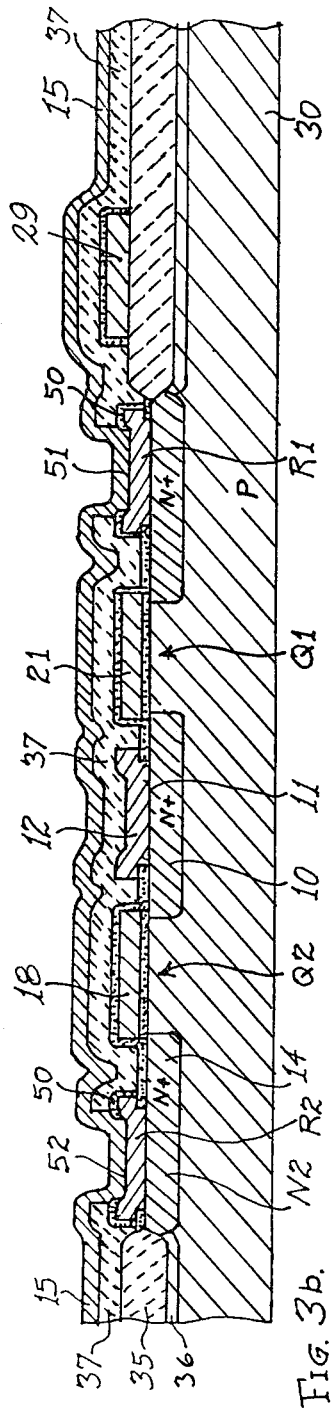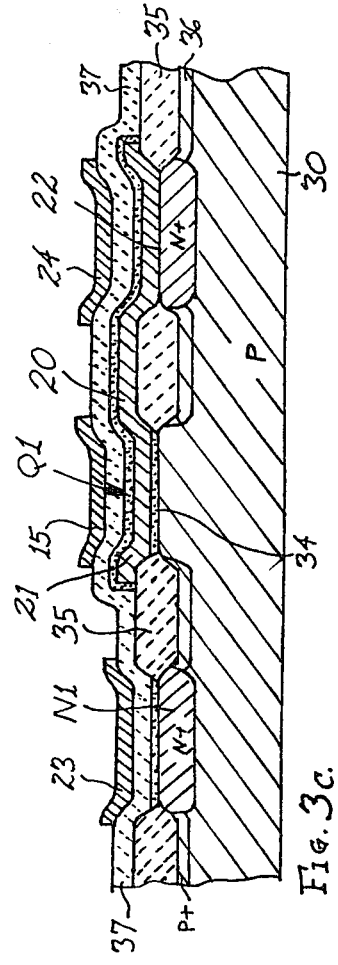

SEMICONDUCTOR INTEGRATED CIRCUIT WITH VERTICAL IMPLANTED POLYCRYSTALLINE SILICON RESISTOR

This is a continuation of application Ser. No. 910,248 filed May 30, 1970 now abandoned.

BACKGROUND OF THE INVENTION

This invention is directed to semiconductor devices and methods of making such device, and more particularly to an improved resistor element in MOS integrated circuits.

In early semiconductor integrated circuits, resistors were provided by diffused regions or by portions of the semiconductor substrate which were defined by etching, as seen in U.S. Pat. No. 3,138,743 issued to Jack S. Kilby and assigned to Texas Instruments. As the density of components in integrated circuits grew, the area occupied by resistors became prohibitive, so logic forms were favored which used few resistors or no resistors. For example, "TTL" or transistor-transistor logic and $I^2L$ or integrated injection logic in bipolar technology had features minimizing the area on a bar dedicated to resistors. In MOS logic and memories, transistors are used as load devices in place of resistors. Examples of every complex MOS circuits containing many thousands of transistors but no resistors in a single chip digital processor or memory are shown in U.S. Pat. No. 3,940,747, issued to Kuo and Kitagawa, U.S. Pat. No. 4,050,061, issued to Kitagawa, and U.S. Pat. No. 3,998,604, issured to J. H. Raymond, Jr., all assigned to Texas Instruments. High density MOS memory devices such as the 4096 and 16384 bit memories described in U.S. Pat. Nos. 3,940,747 and 4,050,061, have been of the dynamic type because dynamic one-transistor cells are the smallest in area.

In some parts of digital equipment, however, the refresh circuitry required for dynamic memories is incompatible or undesirable, so static memory is preferred. Static cells traditionally employ six-transistor bistable circuits wherein depletion-load MOS transistors are used as load devices. These cells are much larger than the one-transistor cells of dynamic memory devices, so the density is less. Also, power dissipation is high due to the requirement that some current must flow through one side of each cell in the array to maintain the stored data.

In copending application Ser. No. 691,252, filed May 28, 1976 by G. R. Mohan Rao, assigned to Texas Instruments, now U.S. Pat. No. 4,246,692, disclosed a resistor element particularly for a static RAM cell wherein the resistors are implanted regions buried beneath field oxide. In application Ser. No. 727,116, filed Sept. 27, 1976 by Rao, Stanczak, Lien and Bhatia, assigned to Texas Instruments, now U.S. Pat. No. 4,110,776 a static cell using implanted resistors in polycrystalline silicon over field oxide is described. Implanted resistors in second level polysilicon are disclosed in copending application Ser. No. 801,699, filed May 31, 1977 by J. H. Raymond, Jr., now U.S. Pat. No. 4,209,716, assigned to Texas Instruments. While these inventions represent marked improvements, further reduction in cell size is needed for highly dense arrays. For example, memory arrays of 64K have been built, and 256K chips are being designed.

It is a principal object of this invention to provide improved resistor elements in integrated circuits. Another object is to provide improved small area resistors for MOS devices of high density. An additional object is to provide small area, high resistance resistors which may be used as load elements for transistors in semiconductor integrated circuits.

SUMMARY OF THE INVENTION

In accordance with the invention, a resistor element is provided in an N-channel, silicon-gate MOS integrated circuit by an ion-implanted area in a vertically oriented part of polycrystalline silicon which may extend over other elements, such as transistors. The resistor area is doped at a much lower level than the remaining areas of the layer of polycrystalline silicon which are highly conductive.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

FIGS. 3a-3c are elevation views in section of the cell of FIG. 1, taken along the lines a—a, b—b, c—c, respectively.

DETAILED DESCRIPTION OF SPECIFIC EMBODIMENT

Figure 1:
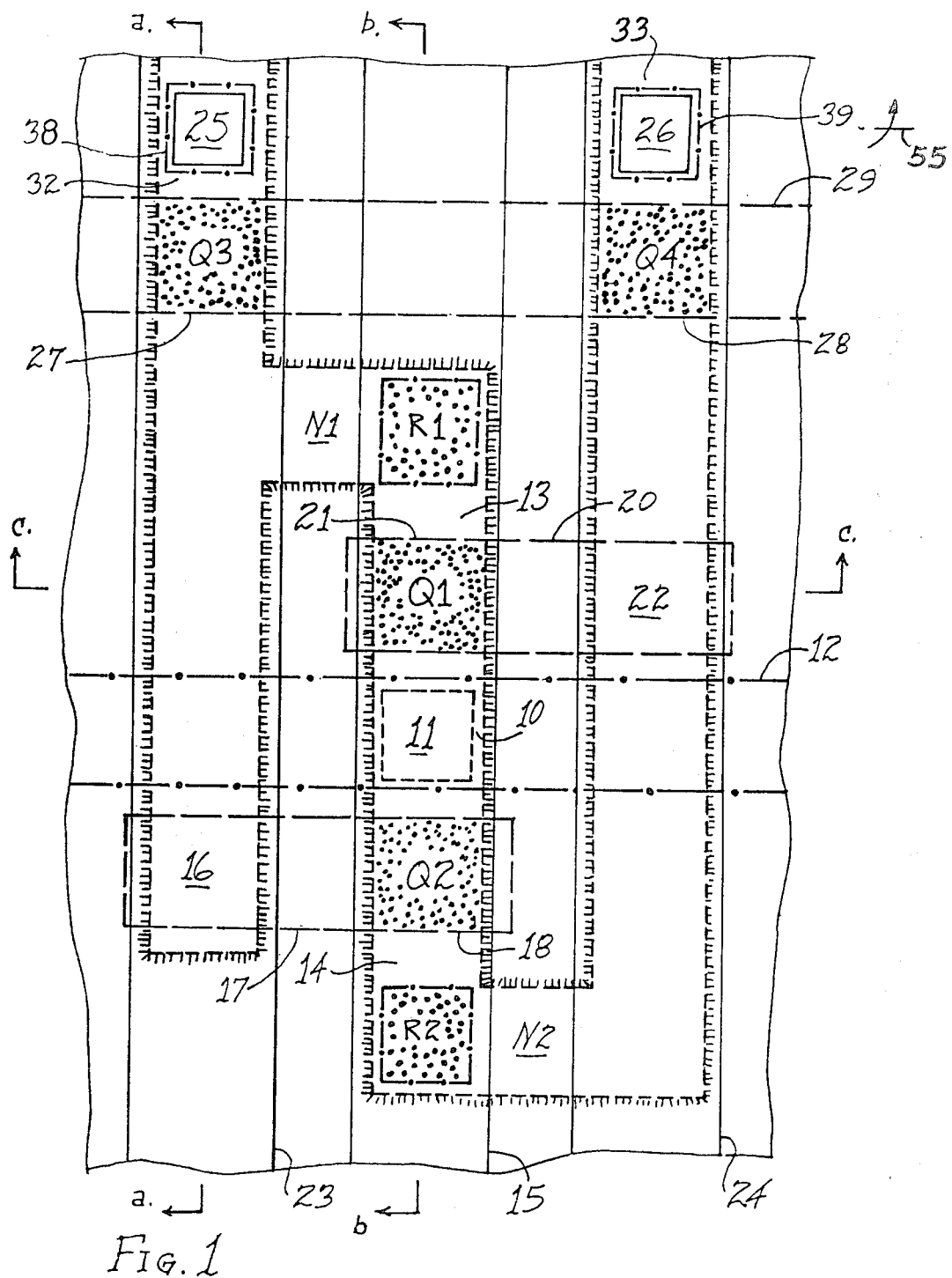
FIG. 1 is a greatly enlarged plan view of a small portion of a semiconductor chip showing the physical layout of a static RAM cell using resistors having the features of the invention.

Referring to FIG. 1, a physical layout is shown of an N-channel silicon gate MOS static RAM cell which utilizes the features of the invention. This cell is of course greatly enlarged in FIG. 1, as it would actually occupy only about one square mil, i.e., the larger dimension of the cell of FIG. 1 would not be more than about one mil. The cell is also shown in FIG. 2 as an electrical schematic diagram, with the parts numbered the same as FIG. 1.

Figure 2:
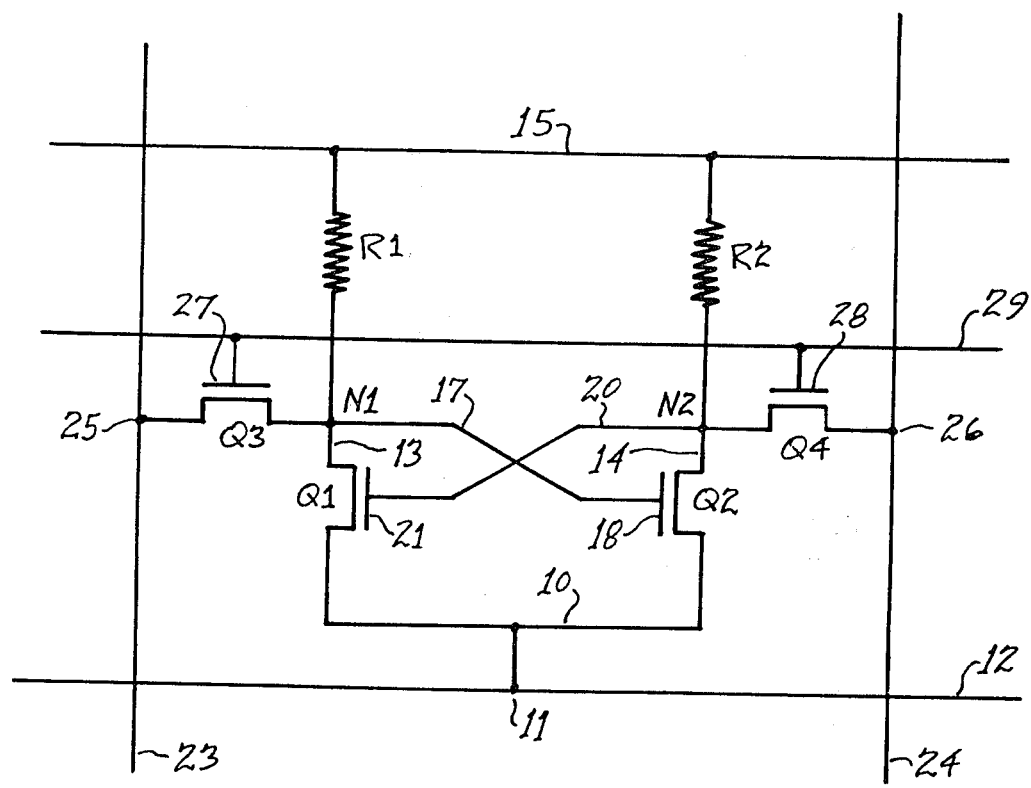
FIG. 2 is an electrical schematic diagram of the cell of FIG. 1.

The cell in FIGS. 1 and 2 consists of a pair of cross-coupled driver transistors Q1 and Q2 which have a common source 10 in the form of an N+ region conneced at a contact area 11 to an elongated second level polysilicon strip 12 which is a ground or Vss line. Each of the transistors Q1 and Q2 has an N+ drain region 13 or 14, respectively, forming nodes N1 and N2 which are electrically connected to a Vdd or positive supply line 15 through a resistor R1 or R2. The resistors R1 and R2 are formed by ion implanted, polycrystalline silicon; these resistors are vertically oriented according to a feature of the invention. The Vdd supply line 15 is an elongated metal strip. A contact area 16 at the drain 13 of the transistor Q1 or node N1 is connected to a first level polysilicon strip 17 which forms the gate 18 of the transistor Q2. In like manner a first-level polysilicon conductor 20 connects the poly gate 21 of the transistor Q1 to the node N2 or the drain 14 at the contact area 22, providing the cross-coupling connection of a bistable or flip-flop circuit. Metal strips which provide data lines 23 and 24 (usually referred to D and D, or as D0 and D1) are connected to the nodes N1 and N2 via coupling transistors Q3 and Q4 and metal-to-moat contacts 25 and 26 which may include a second level poly layer according to the invention disclosed in copending application Ser. No. 801,698, filed May 31, 1977 by Raymond & Lien, now U.S. Pat. No. 4,209,716, assigned to Texas Instruments. The gates 27 and 28 of the transistors Q3 and Q4 are connected to (actually part of) a word address line 29 which is a first-level polysilicon strip.

Referring to FIGS. 3a–3c, sectional views of the cell of FIG. 1 show the details of construction. The cell is a small part of a substrate 30 of P-type silicon. The transistors Q1, Q2, Q3 and Q4 are formed in elongated moat regions in which N+ diffused regions 10, 13, 14, N1 and N2, create the source and drain regions for the transistors. Also, N+ regions 32 and 33 in the moats form the lower part of the metal-to-moat contacts 25 and 26. A thin silicon oxide gate dielectric layer 34 and phosphorus-doped first-level polysilicon areas 17, 18, 20, 21, 27, 28 and 29 form the gates of the transistors, the interconnections, and the address line. The polysilicon strips which form the gates 18 and 21 are parts of the elongated strips which include the cross-coupling interconnects. Thick field oxide 35 exists at all areas where moats including N+ diffused regions or transistors do not exist, and a P+ boron-doped channel-stop region 36 is created under all areas of the field oxide 35. An insulating layer 37 is formed over the entire top surface, overlying the polysilicon, the field oxide 35, and the N+ regions. The lines 15, 23 and 24 are metal strips overlying this insulating layer 37.

As seen in FIG. 1 and FIG. 3b, the resistors R1 and R2, according to a feature of this embodiment, consist of phosphorus ion implanted vertical portions of second-level polycrystalline silicon which connect to the Vdd line 15. The other second-level poly including the segments 38 and 39 the contacts 25 and 26 as well as the line 12 i.e., all second-level poly except for the resistors R1 and R2, is heavily doped with phosphorus so that it will be highly conductive. The size of the resistors R1 or R2 is about 0.15 mil×0.15 mil in area as seen in plan view of FIG. 1, and at least about 5000 Angstroms or 0.5 micron in thickness as seen in a section view in FIG. 3b. Depending upon the desired resistivity, this thickness of the second-level poly could be perhaps one micron. The vertical resistors overly the N+ moat regions which are the drain regions of the trsnsistors Q1 and Q2 resulting in a saving in space on the chip which is quite significant because these drain regions must exist in the same size anyway. Also, the second level poly in which the resistors are formed does not form the gates of transistors, so it is less critical. The cell of FIGS. 1-3 potentially much smaller in size compared to the static cell using implanted resistors as disclosed in applications Ser. No. 727,116 and Ser. No. 801,699.

It is important to note that the second level poly (or its underlying thin oxide) does not function as a diffusion mask; the first level poly defines the extent of the N+ diffusions in the moats by means of the thin oxide 34 which is the diffusion mask. Therefore, the second level poly lines can cross over moats without creating transistors. In double-level poly processes such as shown in applications Ser. No. 648,594, filed Jan. 12, 1976 by C-K Kuo, or Ser. No. 754,144, filed Dec. 27, 1976 by L. S. Wall (now U.S. Pat. No. 4,112,509), the second-level poly is used to define the boundaries of the N+ diffusion, so that neither first nor second level poly interconnections cannot cross over an N+ diffused moat. In the device shown here the only constraint is that first level poly cannot cross an N+ moat without forming a transistor.

Figure 4A:
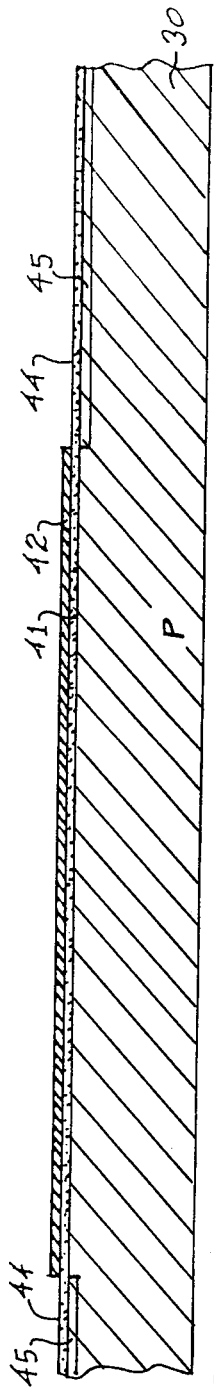
FIGS. 4a-4d are elevation views in section of the semiconductor device of FIGS. 1 and 3, at successive states in the manufacturing process, taken along the line b—b in FIG. 1.

Referring now to FIGS. 4a–4d, a process for making the N-channel, silicon-gate, self-aligned, double-level poly, MOS integrated circuit device of FIGS. 1 and 4a–4d will be described. The starting material is a slice of P-type monocrystalline silicon, perhaps 3 inches in diameter and 20 mils thick, cut on the -100- plane, of a resistivity of about 6 to 8 ohm-cm. In FIGS. 3a or 4a, a wafer or body 30 represents a very small part of the slice, of about one mil in lateral dimension, chosen as a representative sample cross section. Typically, a slice would contain hundreds of bars or chips and each chip 16K cells. First, after appropriate cleaning, the slice is oxidized by exposing to oxygen in a furnace at an elevated temperature of perhaps 1000 degrees C. to produce an oxide layer 41 of a thickness of about 1000 Angstroms. Next a layer 42 of silicon nitride $Si_3N_4$ about 1000 Angstroms thick is formed by exposing to an atmosphere of dichlorosilane and ammonia in a CVD reactor. A coating of photoresist is applied to the entire top surface, then exposed to ultraviolet light through a mask which defines the desired pattern, and developed, leaving areas where nitride is to be etched away and field oxide 35 is to be grown. Alternatively, smaller geometries and thus smaller cell sizes may be obtained by using electron beam lithography in place of uV light and glass masks to expose the photoresist, as disclosed in Bell Laboratories Record, March 1976, p. 69–72 and Electronic Products, February 1977, p. 17. The slice is subjected to a plasma etch, which removes the areas 44 of the nitride layer 42 not covered by the exposed photoresist, but does not remove the oxide layer 41 and does not react with the photoresist.

The slice is next subjected to an ion implant step, whereby boron atoms are implanted in the areas 44 of silicon not covered by photoresist and nitride 42. The photoresist is left in place as an implant mask. Boron is an impurity which produces P-type conductivity, so more heavily doped P+ regions 45 will be produced in the surface. The oxide layer 41 is left in place during the implant because it prevents the implanted boron atoms from out-diffusing from the surface during subsequent heat treatment. The boron implant is at a dosage of about $4 \times 10^{12}/cm^2$ at 100 KeV. After the implant, the photoresist layer is removed.

As will be seen, the regions 45 do not exist in the same form in the finished device, because some of this part of the slice will have been consumed in the oxidation procedure. The implanted regions 45 will ultimately produce the P+ channel stop regions 36.

As set forth in U.S. Pat. No. 4,055,444, issued Oct. 25, 1977 to G. R. Mohan Rao, assigned to Texas Instruments, the next step in the process is to subject the slice to a heat treatment or annealling step, during which the slice is maintained at a temperature of about 1000 degrees C. for about 2 hours in an inert atmosphere, preferably nitrogen. This step causes the boron concentration to change markedly, which has desirble effects aside from reduction in bulk damage in the crystal structure. The P+ regions 45 penetrate deeper into the silicon surface during this anneal step.

Figure 4B:
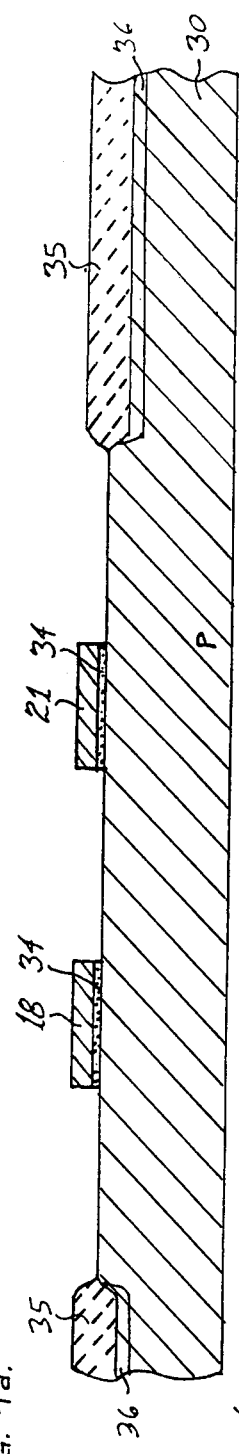
Figure 4C:
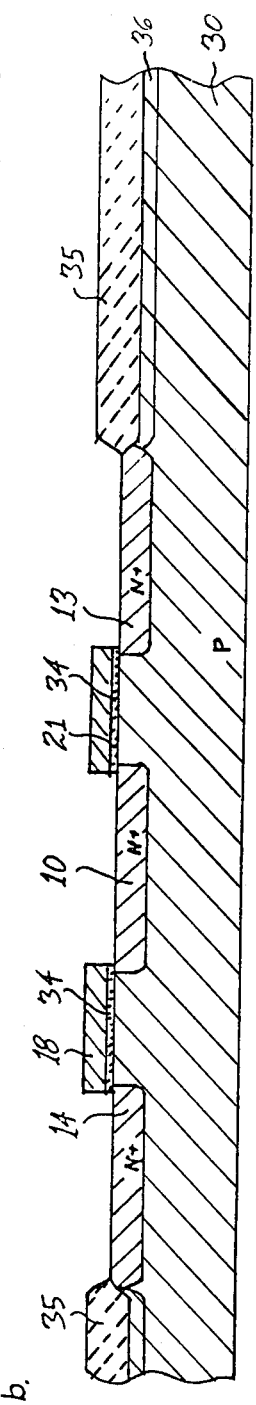

The following step is formation of field oxide, which is done by subjecting the slices to steam or an oxidizing atmosphere at about 950 degrees C for perhaps 10 hours. As seen in FIG. 4b, this causes a thick field oxide region or layer 35 to be grown, and this region extends into the silicon surface because silicon is consumed as it oxidizes. The nitride layer 42 masks oxidation beneath it. The thickness of this layer 35 is about 8000 to 10000 Angstroms, half of which is above the original surface and half below. The boron doped P+ region 45 as previously implanted and modified by the anneal step will be partly consumed, but will also diffuse further into the silicon ahead of the oxidation front. Thus, the P+ regions 36 will result which will be deeper and of more uniform and acceptable concentration at the surface compared to what would have resulted without the anneal step. Also, the regions 36 will not have the extent of crystalline structure damage characteristic of implanted devices.

The nitride layer 42 and its underlying oxide layer 41 are removed by etching and another thin silicon oxide layer 34 of about 800 Angstroms is grown over the exposed ares of silicon, forming the transistor gates.

At this time, although not reflected in the FIGURES, two ion implant steps can be performed to create the desired threshold or operating parameters in transistors in the integrated circuit. First, boron may be implanted in all moat areas for the purpose of adjusting the threshold voltage of thin oxide enhancement mode transistors. Then, a photoresist layer can be applied and patterned to expose the channel areas of depletion load transistors in peripheral circuitry, not in the cell array, and these areas subjected to a phosphorus implant to produce high speed devices in the peripheral circuits. If depletion load transistors had been used in place of the resistors R1 and R2 in the cell array then attaining low standby power dissipation would have been the most important factor (instead of speed in the peripheral circuits) and so speed in terms of access time would be compromised. In addition, of course, the use of the vertical polysilicon resistors R1 and R2 reduces the cell size.

First level polysilicon to moat contacts are patterned and etched using photoresist masking to remove the gate oxide layer 34 in selected areas such as the contact areas 16 and 22 on nodes N1 and N2. Next, a layer of polycrystalline silicon is deposited over the entire slice in a reactor to a thickness of about 0.5 micron using standard techniques, for example by decomposition of silane in hydrogen, producing the first-level polysilicon which is then patterned using photoresist to form the strips 17 and 20, and the line 29. The resulting structure is seen in FIG. 4b. Using the same photoresist which patterns the first level poly, the thin oxide 34 is removed in all exposed areas, leaving oxide only in the transistor gate areas (plus capacitor areas, not shown, which may be needed in peripheral circuitry, as in boot-strap circuits).

Using the remaining first level polysilicon coating and thin oxide 34, as well as the field oxide, as a diffusion mask, the slice is now subjected to an N+ diffusion. Phosphorus is deposited and then diffused into the silicon slice 30 to produce all of the N+ regions 10, 13, 14, N1, N2, 32, 33, etc. The depth of diffusion is about 8000 to 10000 Angstroms. The N+ diffused regions function as conductors which connect the various regions together, and also function as the source or drain regions of all the transistors. This diffusion renders highly conductive all of the exposed polysilicon areas such as gates 18 and 21, the strips 17 and 20, the line 29, etc. In the poly-to-moat contact areas 16 and 22 the N+ diffusion penetrates the poly and converts the underlying P-type silicon to N+ because here the oxide layer 34 has been removed.

Oxide is grown over the first level poly by thermal oxidation to produce a layer 49 of about 2000 Angstroms thickness. At this same time, the exposed silicon in the moat areas is oxidized so the layer 49 extends over the N+ regions 10, 13, 14, 32, 33, etc. The oxide layer 49 is patterned using photoresist to open the contact areas 11, 25 and 26, R1 and R2, i.e. second-poly to first-poly or second-poly-to-moat contact areas.

The second level of polycrystalline silicon is now deposited using a method as for the first level, providing a thickness of about 0.5 micron. The entire second-level polycrystalline silicon coating is subjected to a phosphorus implantation which creates the characteristics of the resistors R1 and R2. Areas of polysilicon which are to be highly conductive will be later subjected to a phosphorus diffusion or implant which will leave them heavily doped. To define the resistor characteristics, this implant step is performed at 100 to 150 KeV to a dosage of from $5 \times 10^{13}$ to $1 \times 10^{14}$ phosphorus atoms per cm$^2$, depending upon the desired bulk resistivity for the resistors. Following this phosphorus implant for the resistors, the slices are annealled in an N$_2$ atmosphere for 30 minutes at 1000 degrees C.; this is for the purpose of distributing the phosphorus properly in the polysilicon. For 0.5 micron thick polysilicon which has a sheet resistivity of ten megohms per square, and with a contact area or lateral area of $5 \times 5$ microns, the resistance of R1 and R2 would be ten megohms. The phosphorus implant serves to produce a resistivity of ideally about one to five meghoms per square at 25 degrees C. Lower resistivity results in too large cell size, and higher results in instability, non-reproducibility and excessive voltage dependence.

Figure 4D:
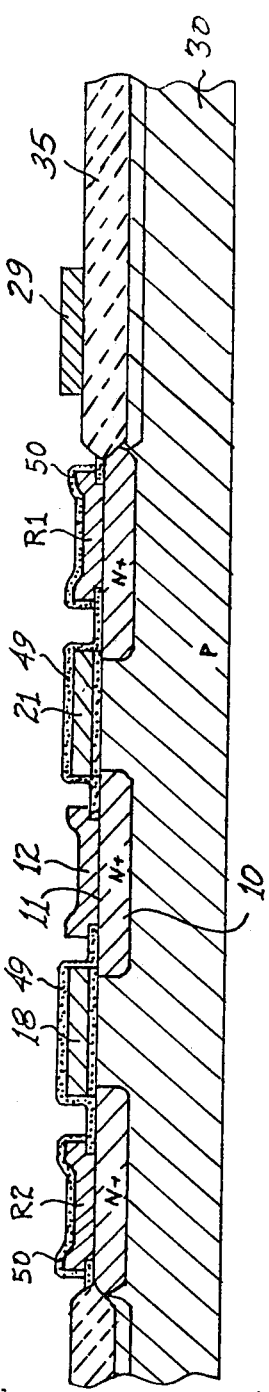

The second level-polysilicon coating is next patterned. This is done by applying a layer of photoresist, exposing to ultraviolet light through a mask prepared for this purpose, developing, then etching with the remaining photoresist masking certain areas of the polysilicon. The resulting structure is seen in FIG. 4d, where a part of the remaining polysilicon layer provides what will be the Vss line 12 and the squares form the resistors R1 and R2. Also, the discrete areas 38 and 39 which reduce the step in a metal-to-moat contact are left in place by this patterning operation.

After patterning the second level polysilicon a protective cap of silicon dioxide is grown on the polysilicon, producing a coating 50 on all exposed surfaces of the poly, including tops and sides. The coating 50 is grown at about 900 degrees C. in steam for about an hour, producing aproximately 1500 Angstroms thickness and consuming part of the polysilicon. The function of the cap is to prevent deposition of impurities on the resistors or diffusion into the resistors. A photoresist masking and etching operation is then used to remove the coating 50 on all areas of second level polysilicon except over the resistors R1 and R2. The masked second-level poly is then subjected to a phosphorus deposition and diffusion, rendering the areas not covered by the oxide 50 highly conductive. Alternatively a phosphorus implant could be used, employing a photoresist mask and no oxide 50; this eliminates the oxidation and later removal of the oxide 50 over the resistor to make contact, and also avoids a high temperature diffusion operation which might cause some out-diffusion from the N+ moat into the resistors R1 and R2.

As seen in FIG. 3b, fabrication of the device is continued by depositing a thick layer 37 of phosphorus-doped oxide. Rather than by oxidizing, this is done by a low temperature reaction process using conventional chemical vpor deposition techniques. A layer 37 of about 10000 Angstroms is produced, covering the entire slice. This deposition is followed by a "densification" step wherein the slice is heated at 950 degrees C. for the purpose of eliminating minute holes or pores in the oxide. Subsequently, a photoresist operation opens windows in the oxide layer 37 in areas 51 and 52 where contact is to be made from metal to the second-level polysilicon resistors R1 and R2, as well as discrete areas 38 and 39 and thus to the moat areas 32 and 33. Although not shown in the FIGURES, at this same time openings are made in the thick oxide 37 where metal to first poly contacts are needed, as in peripheral circuits, though not in the array; for these metal-to-poly contacts a discrete area of second level poly such as the areas 38 and 39 would also be left in place. Then, a layer of aluminum is deposited on the entire slice, and selectively etched using photoresist masking to produce the desired pattern of metal strips 15, 23 and 24.

In an array of a large number of the cells of FIG. 1, the layout on the chip would make use of considerable economy of space by mirroring the cell about an axis 55 to define the cell above the one shown, so the contacts 25 and 26 are shared with the adjacent cell above the axis 59.

A junction could be produced in the vertical resistors R1 and R2 so that the reverse resistance of a PN junction is used as the resistor rather than the bulk resistivity of the polysilicon. This junction would have an inherently higher junction leakage than the PN junctions in the silicon substrate, so conduction in the polysilicon junction would be dominant.

Although the invention has been described with reference to specific embodiments, this description is not meant to be construed in a limiting sense. Various modifications of the disclosed embodiments, as well as other embodiments of the invention, will become apparent to persons skilled in the art upon reference to the description of the invention. It is therefore contemplated that the appended claims will cover any such modifications or embodiments as fall within the true scope of the invention.

What is claimed is:

1. A method of making resistor elements and also making transistor gates in semiconductor integrated circuits, the resistor elements functioning as load resistors for the transistors, comprising the steps of:
   (a) depositing a first layer of polycrystalline silicon on a face of a semiconductor substrate and patterning to define transistor gates, and introducing conductivity determining inpurity selectively to render the gates highly conductive and to form a pattern of transistor areas and heavily doped source/drain conductive regions on the face of a semiconductor substrate;
   (b) depositing a second layer of polycrystalline silicon on said face and patterning the polycrystalline silicon to define separate, interconnect strips and resistor areas spaced from the gates, said layer at least partially overlying some of the heavily doped conductive regions whereby the resistor areas are directly over the heavily doped regions;
   (c) ion implanting conductivity determining impurity material into the second layer of polycrystalline silicon to provide lightly-doped non-rectifying regions at the resistor areas;
   (d) introducing conductivity determining impurity material into selected areas of the second layer of polycrystalline silicon laterally spaced apart from the resistor areas to render said interconnect strips conductive; and
   (e) depositing conductor material on said face to form electrical connections to areas of the second layer of polycrystalline silicon at contact areas directly above the resistor areas to provide vertical resistors in the polycrystalline silicon.

2. A method according to claim 1 wherein the implanting of impurity material is at a dosage equivalent to about $5 \times 10^{13}$ to about $1 \times 10^{14}$ ions per $cm^2$ at about 100 to 150 KeV.

3. A method according to claim 2 wherein the impurity material is phosphorus and the thickness of the polycrystalline silicon is about 0.5 micron.

4. A method according to claim 2 wherein the step of introducing impurity material includes phosphorus diffusion.

5. A method of making a transistor and a non-rectifying resistor element in an integrated circuit comprising the steps of:
   (a) depositing polycrystalline silicon on a face of a semiconductor body and patterning to define a transistor gate, and introducing impurity to make the gate highly conductive and to form a conductive area to provide electrical contact to one side of the resistor and to provide a region of the transistor;
   (b) depositing material on said face directly over said conductive area and also separately over an interconnect area spaced from said conductive area, said material exhibiting substantial resistivity;
   (c) introducing impurity into said interconnect area to create a low resistance interconnect for the transistor while masking said material over said conductive area; and
   (d) depositing a conductive coating directly over said material to provide electrical contact to the other side of the resistor, whereby the resistor is provided by the said material in a vertical direction between said electrical contacts.

* * * * *